United States Patent [19]

Amemiya et al.

[11] Patent Number: 5,490,511
[45] Date of Patent: Feb. 13, 1996

[54] DIGITAL PHASE SHIFTING APPARATUS

[75] Inventors: Shinichi Amemiya; Yoichi Suzuki, both of Tokyo, Japan

[73] Assignee: GE Yokogawa Medical Systems, Ltd, Tokyo, Japan

[21] Appl. No.: 302,710

[22] PCT Filed: Jan. 13, 1993

[86] PCT No.: PCT/JP93/00042

§ 371 Date: Jun. 27, 1994

§ 102(e) Date: Jun. 27, 1994

[51] Int. Cl.$^6$ ............................................. A61B 8/00
[52] U.S. Cl. ........................ 128/660.01; 128/660.07
[58] Field of Search ................... 128/660.01, 660.07, 128/661.01; 73/626; 367/103, 105

[56] References Cited

U.S. PATENT DOCUMENTS

| | | | |
|---|---|---|---|
| 3,997,772 | 12/1976 | Crochiere et al. | 328/155 X |
| 4,787,392 | 11/1988 | Saugeon | 128/661.01 |
| 5,088,496 | 2/1992 | Bernard | 128/661.01 X |
| 5,217,017 | 6/1993 | Matsushima | 128/661.01 |
| 5,249,578 | 10/1993 | Karp et al. | 128/661.01 |
| 5,268,877 | 12/1993 | Odell | 128/661.01 X |
| 5,345,426 | 9/1994 | Lipschutz | 128/661.01 X |

*Primary Examiner*—Francis Jaworski
*Attorney, Agent, or Firm*—Moonray Kojima

[57] ABSTRACT

A digital phase shifting apparatus wherein the phase of a train of sampled digital-data is changed by a fine step shorter than a sampling period using a sampling signal with a fixed phase or a clock signal, the apparatus comprising:

a memory unit for storing the time-axis train of sampled digital data one after another at addresses corresponding to sampling times;

a memory read device for reading out digital data sampled at times ahead of a current sampling time by desired time differences from the memory unit one sampled data after another in synchronization with an operation to sample the time-axis train of sampled of digital data;

registers for holding sampled digital data read out from the memory unit, from a most recently read data to a data ahead of the most recently read data sampled data by a predetermined piece count; and an interpolated-data generating device for summing up a plurality of sampled data held in the registers with a weight applied to each of the data to generate interpolated data at a desired arbitrary point of time within sampling intervals of the sampled digital data held in the registers.

4 Claims, 6 Drawing Sheets

DIGITAL PHASE SHIFTING APPARATUS

TECHNICAL FIELD

The present invention relates to a digital phase shifting apparatus. To put it in more detail, the present invention relates to a digital phase shifting apparatus which is capable of shifting the phase of digital data by a fine step shorter than the sampling period of an A/D converter. The digital phase shifting apparatus is implemented as delay circuits and useful typically for an ultrasonic diagnosing apparatus.

BACKGROUND ART

An example of the conventional digital phase shifting apparatus which is capable of shifting the phase of digital data by a fine step shorter than the sampling period of an A/D converter is disclosed in Japanese Patent Laid-open No. 63-222745. A block diagram showing the configuration of an ultrasonic diagnosing apparatus disclosed in Japanese Patent Laid-open No. 63-222745 is shown in FIG. 7.

In this ultrasonic diagnosing apparatus 51, a signal received from a probe 2 undergoes phase adjustment for all channels by a number of delay circuits (or phase shifting circuits): a first-channel delay circuit 81 to an nth-channel delay circuit 8n. The outputs of the delay circuits are then summed up by an adder 5. The adder 5 carries out a beam forming process for generating a sound-ray reception signal. Based on all the sound-ray reception signals, a scan converter 6 produces pictures to be displayed on a display apparatus 7.

A detailed block diagram of the first-channel delay circuit 81 is shown in FIG. 8. The delay circuits of the other channels each have entirely the same configuration. A signal received by the first-channel delay circuit 81 is supplied to an A/D converter 82. A clock signal having a predetermined period $\Delta T$ is fed to a sampling signal delay means 83. A synchronization signal also having the predetermined period $\Delta T$ is supplied to a synchronization means 84. The synchronization means 83 delays the clock signal by a time $\tau 1$ shorter than the period $\Delta T$, producing a sampling signal output to the A/D converter 82.

The A/D converter 82 samples the signal received by the first-channel delay circuit 81 at sampling intervals equal to $\Delta T$ by using the sampling signal, converting the received signal into digital data. The signal received by the first-channel delay circuit 81 is denoted by notations D and D' in FIGS. 9 and 10 respectively. Digital data obtained by using sampling signals with delay times different from each other is, on the other hand, denoted by symbols ● and ○ in FIGS. 9 and 10 respectively. For a sampling interval $\Delta T$ of 100 ns, the symbols ● and ○ denote sampled digital data for $\tau 1$ equal to 0 and 50 ns respectively.

The synchronization means 84 is used for synchronization. For example, a train of sampled digital data denoted by the symbol ○ lags behind a train of sampled digital data ● due to the synchronization by $\tau 1$, which is shorter than the sampling period, as shown in FIG. 11. A digital delay means 85 is used for further delaying a signal output by the synchronization means 84 by a delay time T1 which is equal to a multiple of the sampling interval $\Delta T$. As a result, the first-channel delay circuit 81 outputs digital data lagging behind the signal received by the first channel by ($\tau 1 + T1$).

A case with T1 and $\tau 1$ having values of 200 ns and 50 ns respectively is shown in FIG. 12. As a whole, the train of sampled digital data denoted by the symbol ○ lags behind the train of sampled digital data denoted by the symbol ● by a total of 250 ns.

In the conventional delay circuits 81 to 8n described above, however, sampling signals to shift the phase by amounts of time slightly different from channel to channel must inevitably be used, giving rise to a problem that the control becomes complicated.

DISCLOSURE OF THE INVENTION

It is an object of the invention to provide a digital phase shifting apparatus which is capable of changing the phase of a train of sampled digital-data by a fine step shorter than the sampling period by means of a sampling signal with a fixed phase or a clock signal.

A digital phase shifting apparatus provided by the present invention is characterized in that the digital phase shifting apparatus comprises:

a memory unit for storing a time-axis train of data sampled at fixed sampling intervals at addresses corresponding to sampling times one piece after another;

a memory read means for reading out data sampled at times ahead of a current sampling time by desired time differences from the memory unit one piece after another in synchronization with an operation to sample the time-axis train of sampled data;

registers for holding pieces of data read out from the memory unit, from a most recently read data to a data ahead of the most recently read data by a predetermined piece count; and an interpolated-data generating means for summing up a plurality of data held in the registers with a weight applied to each of the data to generate interpolated data at a desired point of time within sampling intervals of the data held in the registers.

BRIEF DESCRIPTION OF THE DRAWINGS

FIG. 5 is an explanatory diagram used for describing a state in which a delay time shorter than a sampling interval is resulted in;

FIG. 11 is an explanatory diagram used for describing a state in which a delay time shorter than a sampling interval is resulted in.

DESCRIPTION OF THE PREFERRED EMBODIMENT

The present invention will become apparent from the following detailed description of a preferred embodiment with reference to accompanying diagrams. It should be noted, however, that the range of the present invention is not limited to the preferred embodiment.

Figure 1:
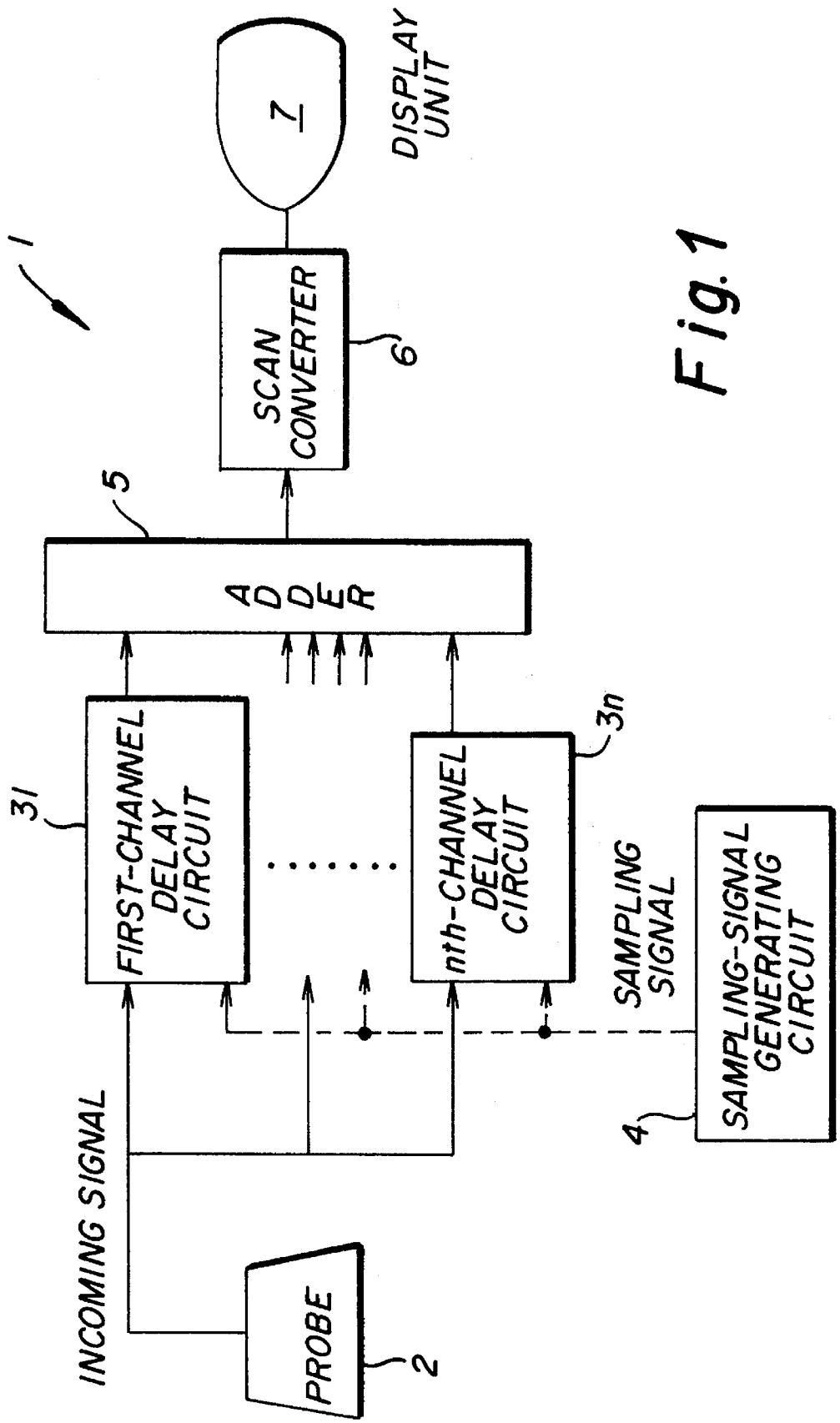
FIG. 1 is a block diagram of an ultrasonic diagnosing apparatus provided by the present invention.

A block diagram of an ultrasonic diagnosing apparatus 1 employing a digital phase shifting apparatus provided by the present invention is shown in FIG. 1.

In the ultrasonic diagnosing apparatus 1, a plurality of signals (labeled "incoming signal") for n channels received by a probe 2, e.g. comprising a plurality of phased array transducer elements, are applied through a bus (unnumbered) and undergo phase adjustment for the individual channels in a number of delay circuits (or phase shifting circuits): a first-channel delay circuit 31 to an nth-channel delay circuit 3n. Outputs of the delay circuits are summed up by an adder 5. The adder 5 then carries out a beam forming process to produce a sound-ray signal. Based on all the sound-ray signals, a scan converter 6 generates pictures to be displayed on a display unit 7.

The delay circuits 31 to 3n are provided with a common sampling signal generated by a sampling-signal generating circuit 4.

Figure 2:
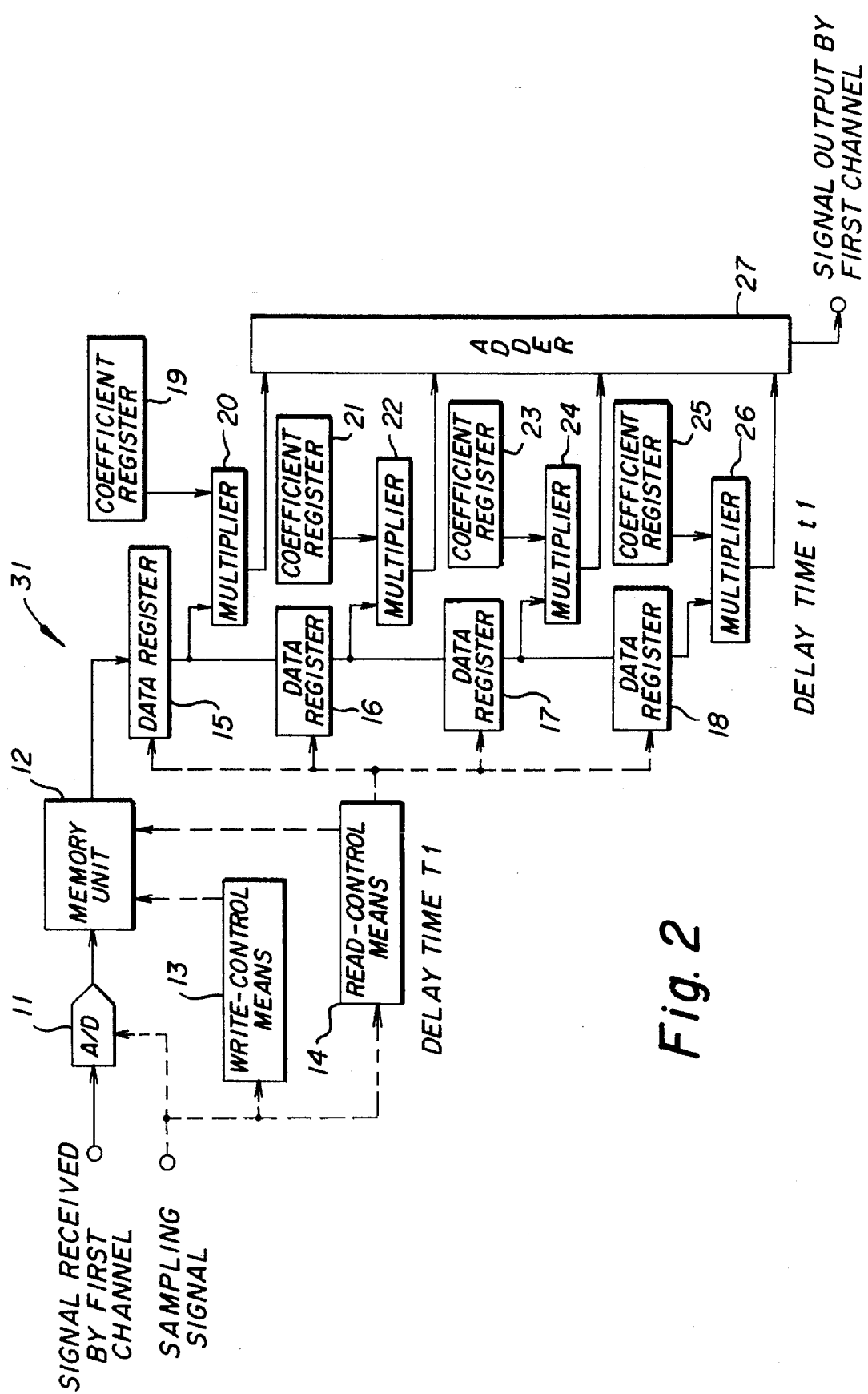
FIG. 2 is a block diagram of an embodiment implementing a delay circuit in accordance with the present invention.

A detailed block diagram of the first-channel delay circuit 31 is shown in FIG. 2. The delay circuits of the other channels have exactly the same configuration. An analog signal received by the first channel is supplied to an A/D converter 11. A sampling signal having a period $\Delta T$ is fed to the A/D converter 11, a write-control means 13 and a read-control means 14.

Figure 3:
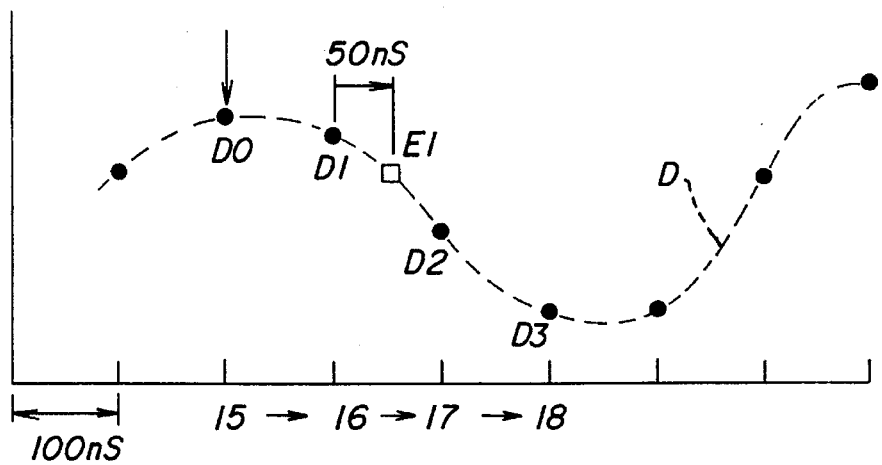
FIG. 3 is an explanatory diagram used for describing interpolated data.

Driven by the sampling signal, the A/D converter 11 samples the signal received by the first channel at sampling intervals each equal to the period $\Delta T$. In FIG. 3, the analog signal received by the first channel is indicated by a notation D whereas sampled digital data is denoted by a symbol ●. A case with a sampling interval $\Delta T$ of 100 ns is shown in FIG. 3. The sampled digital data is stored in a memory unit 12 at an address specified by the write-control means 13. The memory unit 12 outputs data stored at an address specified by the read-control means 14. A difference between addresses specified by the write-control means 13 and the read-control means 14 corresponds to a desired multiple of the sampling interval $\Delta T$. These addresses are updated synchronously with the sampling signal.

A data register 15 is used for storing sampled digital data read out from the memory unit 12. Each time new sampled digital data is stored into the data register 15, sampled digital data stored previously in the data register 15 is shifted to a data register 16. At the same time, sampled digital data are shifted from the data register 16 to a data register 17, and from the data register 17 to a data register 18. In this way, four sampled of digital data sampled at points of time separated from each other by the sampling interval $\Delta T$ are stored in the data registers 15 to 18. The four sampled data are updated by the shifting operations synchronously with the sampling signal. The read-control means 14 controls operations to read data from the memory unit 12 in such a way that four sampled data stored in the data registers 15 to 18 are ahead of the current sampling time by $(T1-\Delta T)$, $T1$, $(T1+\Delta T)$ and $(T1+2\Delta T)$ respectively.

Data with a fine delay time $\tau 1$ shorter than the sampling time $\Delta T$ is formed from the four sampled data typically by means of mixed spline interpolation to be described later.

Coefficient registers 19, 21, 23 and 25 are each used for storing an interpolation coefficient for use in the mixed spline interpolation. Multipliers 20, 22, 24 and 26 are used for multiplying the digital data stored in the data registers 15, 16, 17 and 18 by the interpolation coefficients of the mixed spline interpolation stored in the coefficient registers 19, 21, 23 and 25, respectively. The products are outputted to an adder 27 to be summed up. The operations to process such data and generate the output are carried out synchronously with the sampling signal.

A concept of computing interpolated digital data E1 by the mixed spline interpolation from four sampled digital data D0 to D3 stored in the data registers 15 to 18 respectively is shown in FIG. 3. The figure shows a case with $\Delta T=100$ ns and $\tau 1=50$ ns.

For example, let the digital data E1 be data interpolated between the data D1 and D2 and the distance from the data E1 to a point of interpolation be $u\Delta T$. According to a formula of the mixed spline interpolation, the E1 is given by the following equation:

$$E1 = -(\tfrac{1}{6})u(u-1)(u-2)D0 + (\tfrac{1}{2})(u+1)(u-1)(u-2)D1 - (\tfrac{1}{2})(u+1)u(u-2)D2 + (\tfrac{1}{6})(u+1)u(u-1)D3$$

It is obvious from the above equation that the interpolated data E1 is a sum of the four sampled data D0 to D1 with each sampled data multiplied by a predetermined weight coefficient. The coefficients are univocally determined by a relative distance u from the data D1 to the point of interpolation. For $\tau 1=50$ ns, the relative distance u is 0.5. Coefficients for a desired point of interpolation are stored in the coefficient registers 19, 21, 23 and 25 in advance to be used in the addition by the adder 27 to give the desired interpolated data E1.

Figure 4:
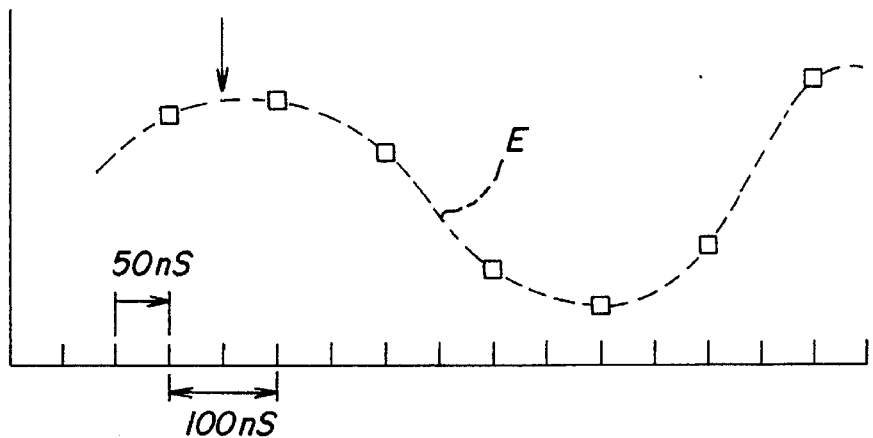
FIG. 4 is an explanatory diagram used for describing a train of pieces of digital data obtained by interpolation.
Figure 5:
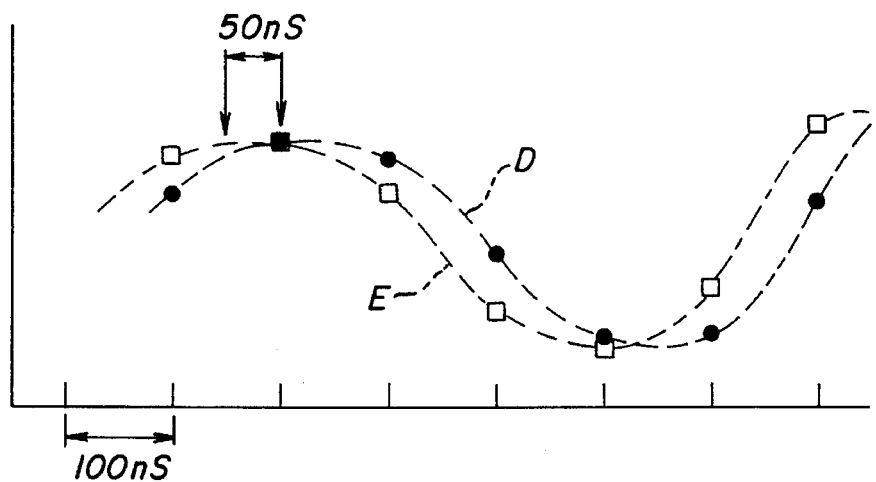
Figure 6:
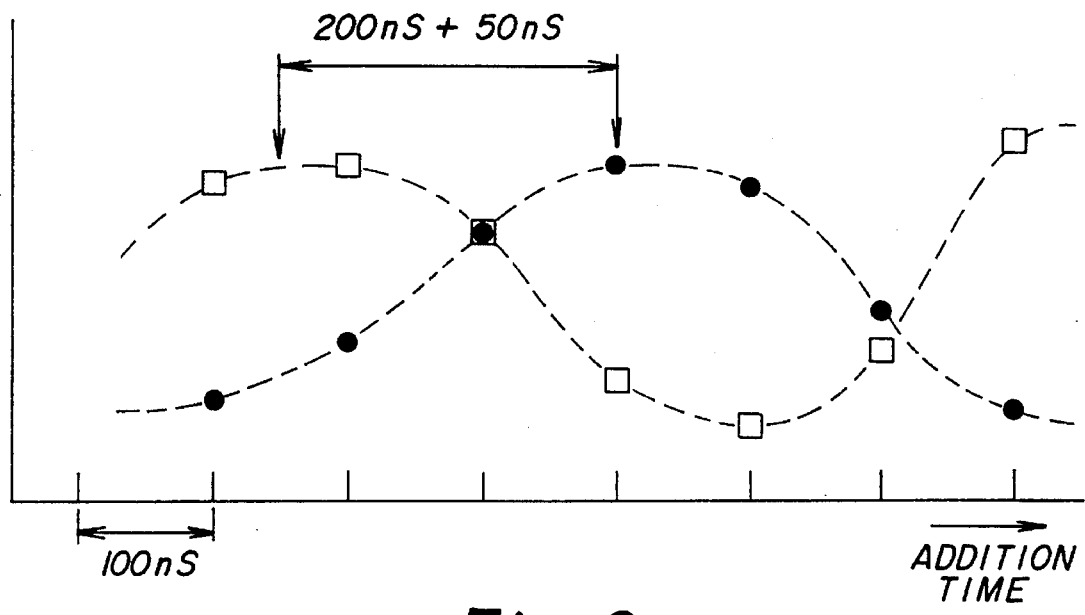
FIG. 6 is an explanatory diagram used for describing a state in which a long delay time is resulted in as a whole.
Figure 12:
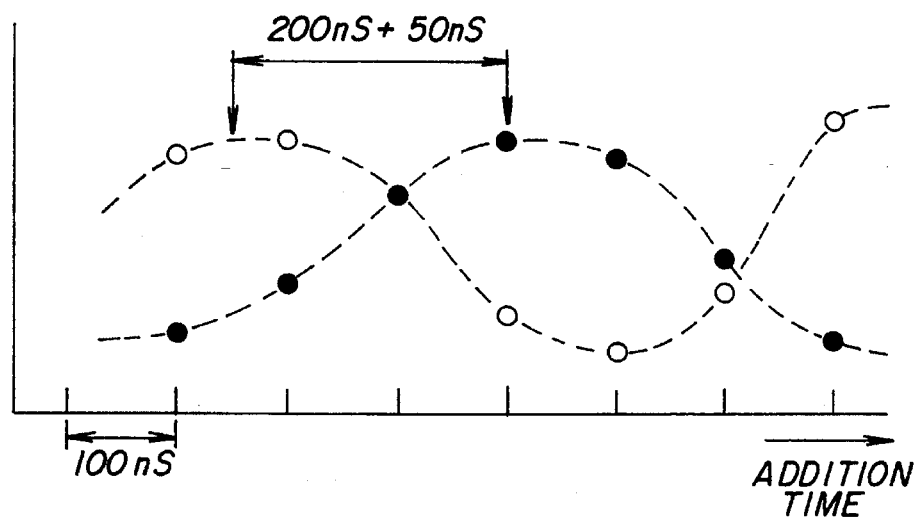
FIG. 12 is an explanatory diagram used for describing a state in which a long delay time is resulted in as a whole.
Figure 7:
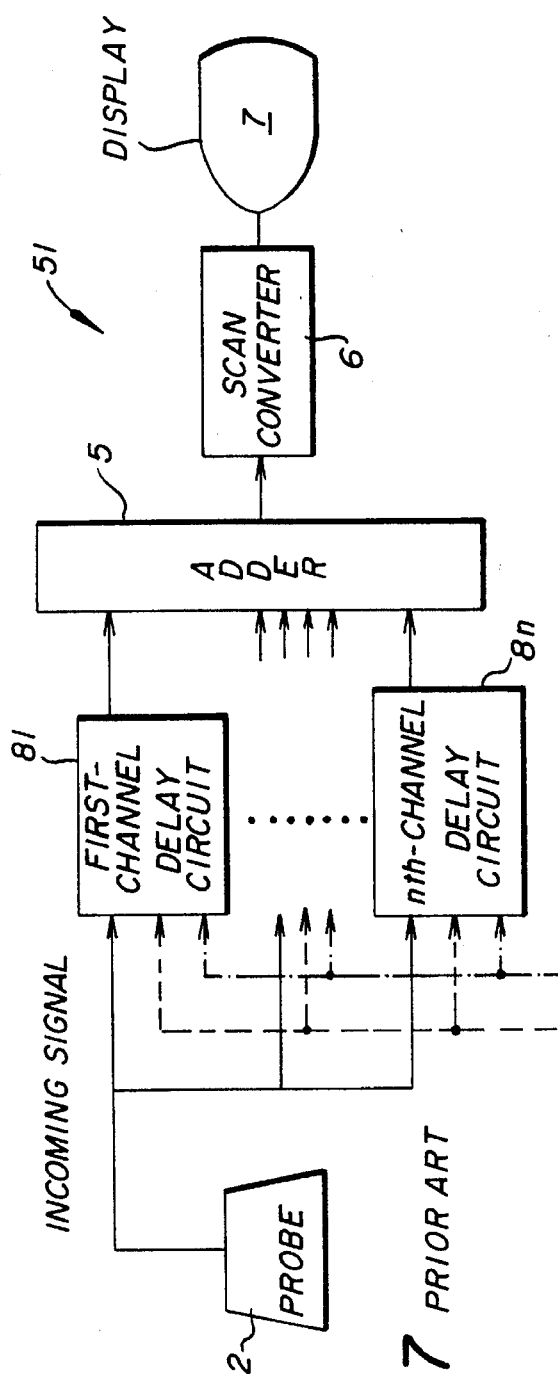
FIG. 7 is an explanatory diagram used for describing the conventional ultrasonic diagnosing apparatus.
Figure 8:
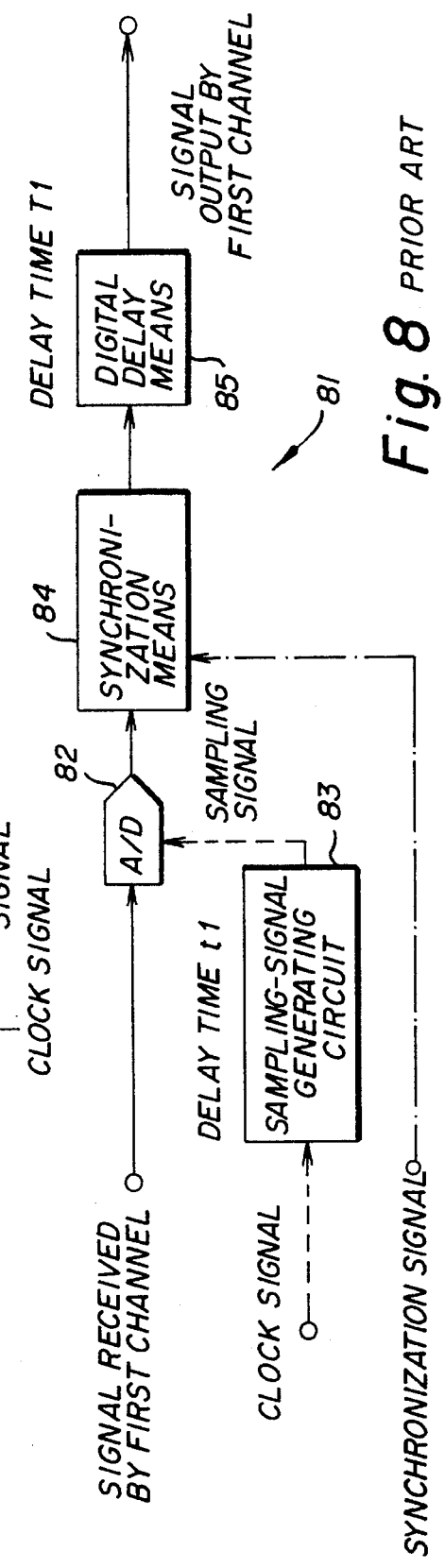
FIG. 8 is a block diagram of the conventional delay circuit.
Figure 9:
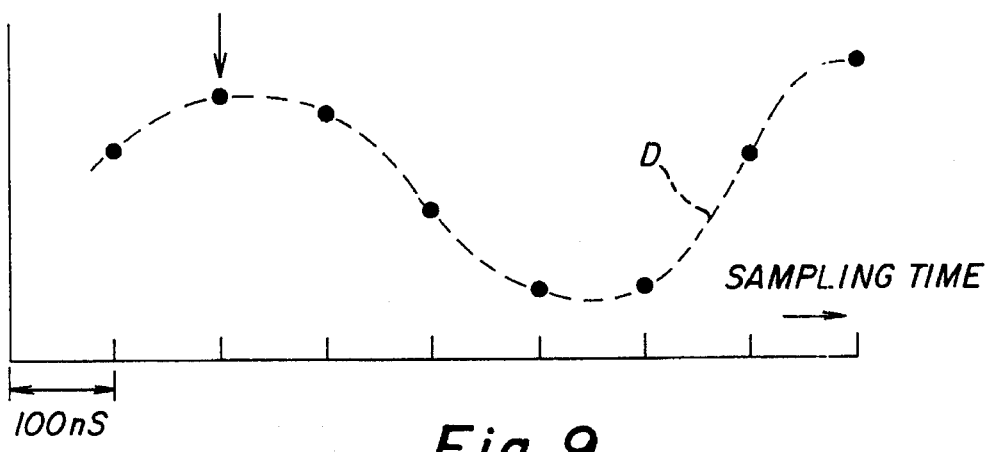
FIG. 9 is an explanatory diagram used for describing digital data produced by a sampling signal without delay.
Figure 10:
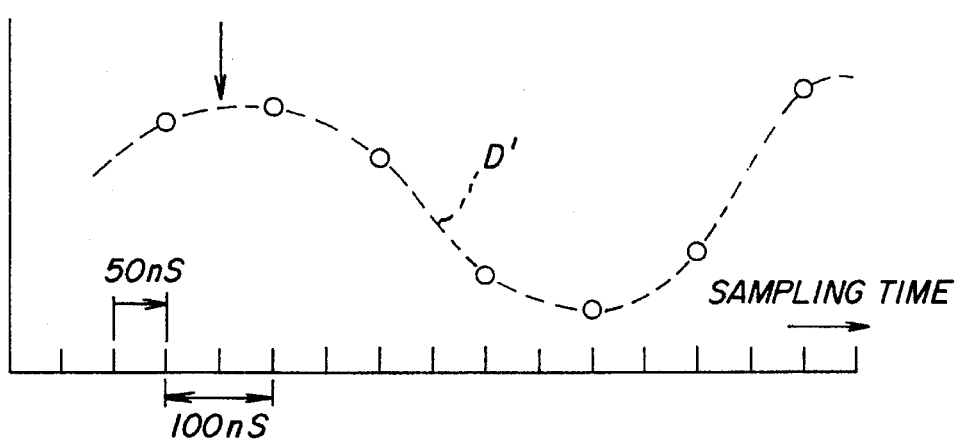
FIG. 10 is an explanatory diagram used for describing digital data produced by sampling signals with delays.
Figure 11:
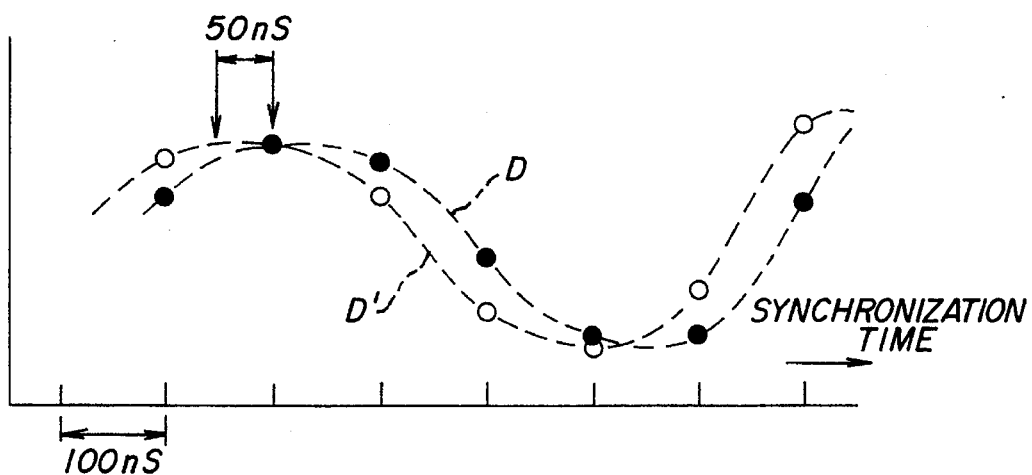

A signal output by the first channel is shown in FIG. 4 as a time-axis series of pieces of digital data each denoted by a symbol □. The output signal of the first channel is digital data lagging behind the digital data stored in the data register 16 by 50 ns as shown in FIG. 5. It should be noted that the amount of delay $\tau 1$ is not limited to the value 50 ns. The amount of delay $\tau 1$ can be determined arbitrarily by selecting the position of the interpolation point. On the other hand, the digital data stored in the data register 16 was obtained at a sampling time ahead of the current sampling time by T1. As a result, the data E1 is digital data lagging by the sum $(T1+\tau 1)$. A typical case for $T1=200$ ns and $\tau 1=50$ ns is shown in FIG. 6. The case shown in FIG. 6 corresponds to that of FIG. 12.

The delay circuits of the other channels each carry out the same operations to produce a train of sampled data lagging behind the signal input to the channel by a desired time.

A single train of sampling pulses common to the delay circuits 31 to 3n described above is used without adjusting its phase, resulting in control simpler than that of the conventional system. On top of that, stability of the delay time is enhanced. It should be noted that the use of the mixed spline interpolation allows calculation to be based on only four points before and after an interpolation point. As a result, the interpolation technique is suitable for a real-time system. On top of that, the interpolation coefficients are determined univocally for a given delay time $\tau 1$, allowing the mixed spline interpolation to be implemented by the same configuration as that of a transversal filter for example. The foregoing description is illustrative of the principles of the invention. Numerous extensions and modifications thereof would be apparent to the worker skilled in the art. All such extensions and modifications are to be considered to be within the spirit and scope of the invention.

What is claimed is:

1. A digital phase shifting apparatus comprising:

sampling signal generating means for generating sampling signals at selected time intervals;

means for sampling analog input signals at sampling time intervals provided by said sampling signal generating means and for generating a time-axis train of sampled data therefrom;

memory means for storing the time-axis train of sampled data one after another sampled at fixed sampling intervals at addresses corresponding to sampling times;

read means for reading out data sampled at times ahead of a current sampling time by desired time differences from said memory means one after another in synchronization with sampling which provides said time-axis train of sampled data;

a plurality of register means for holding sampled data read out from said memory means, said sampled data being selected from a most recently read out data to a data ahead of the most recently read out data by a predetermined data count; and interpolated data generating means for summing up a plurality of sampled data held in said plurality of register means with a weighted coefficient applied to each sampled data to generate interpolated data at a desired arbitrary point in time within sampling intervals of the sampled data held in said plurality of register means, wherein said interpolated data generating means comprises a plurality of coefficient register means corresponding to said plurality of register means and for holding a predetermined weighted coefficient, a plurality of multiplier means corresponding to said plurality of register means and to said plurality of coefficient register means, and for multiplying a sampled data from the corresponding register means with a weighted coefficient from the corresponding coefficient register means, and an adder means for summing up outputs from said plurality of multiplier means.

2. A digital phase shifting apparatus according to claim 1 wherein, said interpolated data generating means comprises means for obtaining data at the desired arbitrary point of time within the sampling intervals of the sampled data held in said plurality of register means by mixed spline interpolation.

3. A digital phase shifting apparatus according to claim 1, wherein said time-axis train of sampled data is obtained by means for analog-to-digital conversion of a time-axis analog signal using a constant sampling period.

4. A digital phase shifting apparatus according to claim 1, wherein said plurality of coefficient register means weighted coefficients in said plurality of coefficient register means.

* * * * *